United States Patent [19]

Ogura

[11] Patent Number: 5,414,282
[45] Date of Patent: May 9, 1995

[54] SEMICONDUCTOR OPTOELECTRONIC SWITCH AND METHOD FOR DRIVING THE SAME

[75] Inventor: Ichiro Ogura, Tokyo, Japan

[73] Assignee: NEC Corporation, Tokyo, Japan

[21] Appl. No.: 93,717

[22] Filed: Jul. 20, 1993

[30] Foreign Application Priority Data

Jul. 22, 1992 [JP] Japan .................. 4-216417

[51] Int. Cl.6 .............. H01L 31/12; H01L 31/16
[52] U.S. Cl. ................. 257/187; 257/85; 257/198; 257/98; 257/462
[58] Field of Search ............. 257/187, 184, 185, 191, 257/198, 80, 83, 84, 85, 94, 98, 462, 577; 365/154

[56] References Cited

U.S. PATENT DOCUMENTS

| | | | |
|---|---|---|---|
| 3,564,300 | 2/1971 | Henle | 365/154 |
| 3,686,645 | 8/1972 | Brojdo | 365/154 |
| 4,160,258 | 7/1979 | Dawson et al. | 257/187 |
| 4,573,064 | 2/1986 | McLevige et al. | 257/198 |
| 4,672,414 | 6/1987 | Gabriel et al. | 257/198 |
| 5,041,882 | 8/1991 | Katoh | 257/198 |
| 5,216,538 | 6/1993 | Twynam | 257/462 |

OTHER PUBLICATIONS

K. Kasahara et al, "Double heterostructure optoelectronic switch as a dynamic memory with low-power consumption", 1988 *American Institute of Physics*, Feb. 29, 1988, pp. 679–681.

*Primary Examiner*—Sara W. Crane
*Attorney, Agent, or Firm*—Young & Thompson

[57] ABSTRACT

The invention provides a heterostructure optoelectronic switching device showing a switch operation in response to a light injection for a subsequent light emission. The switching device comprises a pair of first and second bipolar transistors made of semiconductors showing a direct band-to-band transition. Each of the first and second bipolar transistors comprises collector and emitter layers and a base layer having a narrower energy band gap than energy band gaps of the collector and emitter layers. The base layers of the first and second bipolar transistors are connected to the collector layers of the second and first bipolar transistors respectively to allow the device to have a positive feedback feature. The emitter layers of the first and second bipolar transistors are connected to a first terminal. The collector layers of the first and second bipolar transistors are connected respectively through first and second resistors to a second terminal applied with a voltage higher than a voltage applied to the first terminal.

13 Claims, 11 Drawing Sheets

SEMICONDUCTOR OPTOELECTRONIC SWITCH AND METHOD FOR DRIVING THE SAME

BACKGROUND OF THE INVENTION

The invention relates to a semiconductor optoelectronic switch and a method of driving the same.

The value and importance of developments of optical or optoelectronical devices are on the increase in recent years due to suitable properties of lights such as a small interference or its transmission in space. Such properties of lights allow high density data and information transmissions to be realized. It is then expected that utilization of such properties of lights permits high speed and large capacity information processing.

Optoelectronic switches having a double heterostructure have been proposed as one of optoelectronic switches utilizing the above properties of light. Usage of optoelectronic devices having excellent performances due to the above-described properties of light requires an integration of the devices into two-dimensional arrays and light input/output operations in the vertical direction. Also the optoelectronic switches are, therefore, required to be integrated into the two-dimensional arrays. To realize the above matter, an optoelectronic switch having a pnpn double heterostructure has been proposed by K. Kasahara et al. in Applied Physics Letters 52(9), 29 February 1988 as entitled "Double heterostructure optoelectronic switch as a dynamic memory with low-power consumption".

The pnpn double heterostructure optoelectronic switch has the following structure which may be regarded as a thyristor. With reference to FIG. 1, epitaxial layers are grown on a semi-insulating GaAs substrate by a molecular beam epitaxy. An n-GaAs buffer layer having a thickness of 0.5 micrometers and a dopant concentration of $2 \times 10^{18}$ cm$^{-3}$ is formed on the GaAs substrate. An n-Al$_{0.4}$Ga$_{0.6}$As layer having a thickness of 1 micrometer and a dopant concentration of $5 \times 10^{17}$ cm$^{-3}$ is formed on the buffer layer. A p-GaAs layer having a thickness of 50 angstroms and a dopant concentration of $2 \times 10^{19}$ cm$^{-3}$ is formed on the n-Al$_{0.4}$Ga$_{0.6}$As layer. An n-GaAs active layer having a thickness of 1 micrometers and a dopant concentration of $1 \times 10^{17}$ cm$^{-3}$ is formed on the p-GaAs layer. A p-Al$_{0.4}$Ga$_{0.6}$As layer having a thickness of 0.5 micrometers and a dopant concentration of $5 \times 10^{18}$ cm$^{-3}$ is formed on the active layer. A p-GaAs contact layer having a thickness of 0.15 micrometers and a dopant concentration of $1 \times 10^{18}$ cm$^{-3}$ is formed on the p-Al$_{0.4}$Ga$_{0.6}$As layer. An anode and a cathode are provided on the p-GaAs contact layer and on the n-GaAs buffer layer respectively. An n-gate is provided on the n-GaAs layer. A p-diffusion region is formed in the n-GaAs layer so as to reach the p-GaAs layer formed thereunder. A p-gate is provided on the p-diffusion region through which the p-gate is connected to the p-GaAs layer. Namely, the anode and cathode are provided at opposite ends of the pnpn structure so that the thyristor is forward-biased.

The optoelectronic switch has the following characteristics. The optoelectronic switch is sensitive to light for a subsequent switch operation. The optoelectronic switch has a window through which light is injected. When the switch forward-biased through the anode and the cathode receives light, the semiconductor layer has a light energy absorption thereby carries or electron-hole pairs are generated. The forward bias makes the carriers become a current flow. This results in the switch exhibiting a switching operation from the OFF state to the ON state. It would of course be desirable that the switch exhibits as high speed performance as is possible. The high speed performance depends not only upon the semiconductor heterostructure but also its turn-off characteristic. The turn-off characteristic is associated with the time needed for a reset operation or a switching operation from the ON state to the OFF state. Needless to say, it would be desirable that the time for the turn-off operation be as short as possible. A completion of the reset operation requires almost all carriers to be extracted, and thus excess carriers stored during the ON state to be extracted from the switch. The optoelectronic switch needs a relatively long time for the reset operation due to such a structure thereof as to have the excess carriers remain therein. To settle the above problem, the p-gate and the n-gate serve as dual extractor electrodes which promote the extraction of the excess carriers accumulated during the ON state from the switch for a completion of a subsequent high speed reset operation. Such high speed reset operation is desirable for a high speed switching operation.

The optoelectronic switch, however, has not only the above advantage in the high speed reset operation, but also the following disadvantages. The four-electrode structure of the anode, the cathode and the dual extract electrodes is unsuitable for the integration thereof into the two-dimensional arrays. For the integration of the devices into the two-dimensional arrays, it would be undesirable to provide the four electrodes to the switch due to a complication of fabrication processes which further provides a complication of driver circuits. This results in less uniformity or more variation of the properties of the switch which provides a low yield to the fabrication thereof.

It would therefore be required to provide a novel optoelectronic switch which not only possesses excellent performances such as high speed switching performance but also has a suitable structure for the integration thereof into the two-dimension arrays.

SUMMARY OF THE INVENTION

Accordingly, it is a primary object of the present invention to provide a novel optoelectronic switching device.

It is a further object of the present invention to provide a novel optoelectronic switching device which has a suitable structure for an integration thereof into two dimensional arrays.

It is a further object of the present invention to provide a novel optoelectronic switching device which is suitable for an integration thereof into two dimensional arrays.

It is a still further object of the present invention to provide a novel optoelectronic switching device which is free from a disadvantage in fabrication processes.

It is yet a further object of the present invention to provide a novel optoelectronic switching device which is free from a complication of fabrication processes.

It is a furthermore object of the present invention to provide a novel optoelectronic switching device which has uniformity in its excellent properties.

It is a furthermore object of the present invention to provide a novel optoelectronic switching device which possesses a high speed switching performance.

It is a furthermore object of the present invention to provide a novel optoelectronic switching device which exhibits a high speed turn-off or reset operations.

The above and other objects, features and advantages of the present invention will be apparent from the following description.

The present invention provides a heterostructure optoelectronic switching device which switches in response to a light injection for a subsequent light emission. The switching device comprises a pair of first and second bipolar transistors made of semiconductors having a direct band-to-band transition. Each of the first and second bipolar transistors comprises collector and emitter layers and a base layer having a narrower energy band gap than those of the collector and emitter layers. The base layers of the first and second bipolar transistors are connected to the collector layers of the second and first bipolar transistors respectively to allow the device to have a positive feedback feature. The emitter layers of the first and second bipolar transistors are connected to a first terminal connected to a ground line. The collector layers of the first and second bipolar transistors are connected respectively through first and second resistors to a second terminal which is connected to a DC power supply.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1:
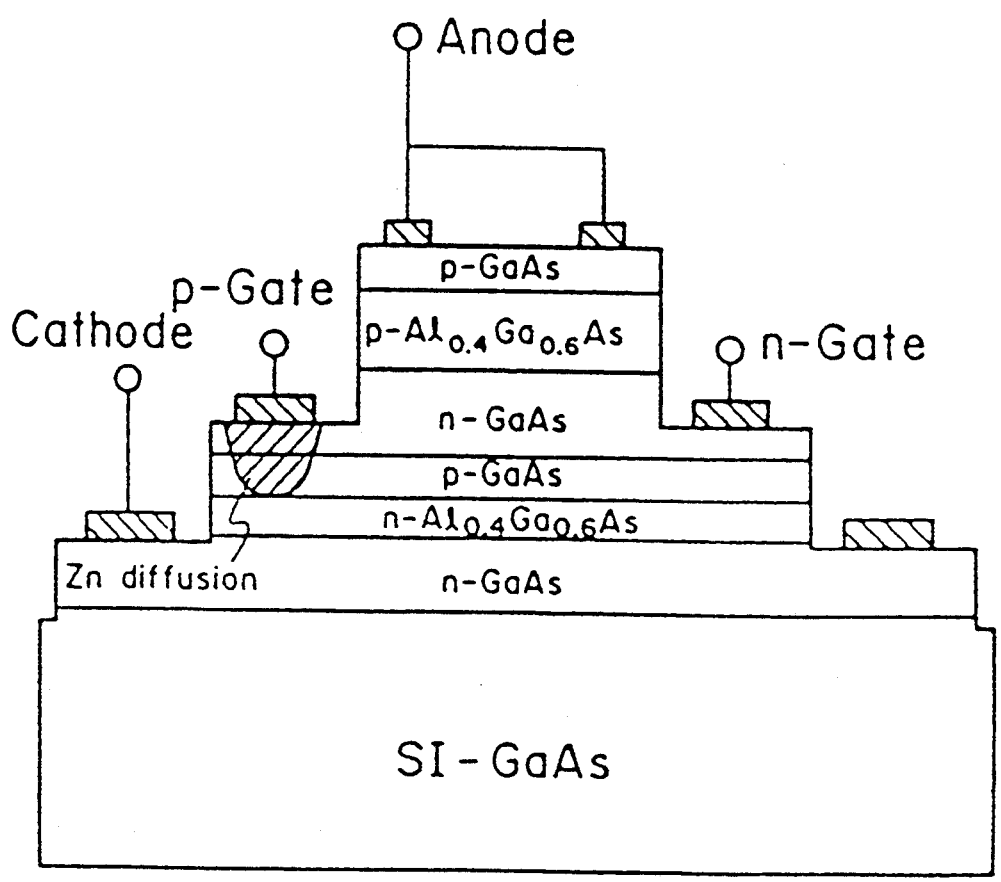
FIG. 1 is a fragmentary cross sectional elevation view illustrative of the structure of the conventional double heterostructure optoelectronic switch.

The present invention provides a novel semiconductor optoelectronic switch having a structure suitable for integration into two-dimensional arrays. The novel semiconductor optoelectronic switch is free from additional electrodes for extracting excess carriers from the switch in a reset operation or a turn-off operation. Namely, the novel semiconductor optoelectronic switch has no extractor electrode nor other additional electrode for a realization of a simple structure suitable for the integration thereof into the two dimensional arrays. The novel semiconductor optoelectronic switch also has a simple structure to permit the switch to be free from disadvantages in a complication of fabrication processes. The novel semiconductor optoelectronic switch possesses excellent properties such as a high speed performance, and particularly a high speed turn-off or reset performance.

The novel semiconductor optoelectronic switch includes a pair of first and second bipolar transistors having a double heterostructure being made of semiconductors which have a direct band-to-band transition between different atomic energy levels either to absorb or to emit electromagnetic radiations or light. Each of the first and second bipolar transistors includes collector and emitter regions made of semiconductors having energy band gaps and a base region made of a semiconductor having a narrower energy band gap than the energy band gaps of the collector and emitter regions. The bases of the first and second bipolar transistors are electrically connected to the collectors of the second and first bipolar transistors respectively. The emitter and the base of each of the first and second bipolar transistors are biased in the forward direction. The base and the collector of each of the first and second bipolar transistors are biased in the reverse direction. Namely, the emitters of the first and second bipolar transistors are connected to a ground line. The collectors of the first and second bipolar transistors are connected through first and second resistors to the positive side of a DC power supply. Each of the first and second transistors has a window through which light is injected.

Light is injected into one of the first and second bipolar transistors through the window and then the base region shows an absorption of the light by which electrons make a direct band-to-band transition for a subsequent generation of electron-hole pairs serving as carriers. Since the bipolar transistor has been biased, the generated electron-hole pairs carriers become a base current. The base current causes a collector current which is defined by multiplying the base current by a current gain of the bipolar transistor. The collector current flows through the resistor connected between the collector of the bipolar transistor and the positive side of the DC power voltage supply. This results in that a potential drop appears at the collector due to a voltage consumption through the resistor. Since the collector of the bipolar transistor into which the light has been injected is electrically connected to the base of the other bipolar transistor, the base of the other transistor has the same potential as that of the collector of the light injected bipolar transistor. The voltage drop at the collector of the light injected bipolar transistor causes the voltage of the base of the other bipolar transistor to drop to the same potential as that of the above collector. In the other bipolar transistor, the forward bias between the emitter and the base is then so reduced as to have the other bipolar transistor take a cut-off state. The collector current of the other bipolar transistor then becomes small or almost zero. Since the resistor connected to the collector of the other bipolar transistor consumes a small voltage or almost zero voltage, the collector of the other bipolar transistor has a potential near to that of the DC power supply. Since the collector of the other bipolar transistor is connected to the base of the light injected bipolar transistor, the forward bias between the base and the emitter of the light injected bipolar transistor increasingly rise, to thereby increase the collector current of the light injected bipolar transistor. As a result, a positive feedback system is accomplished so that the bipolar transistor which has received the light once remains ON state even after the light injection is discontinued. The light injected bipolar transistor continues to emit the light until the DC power supply supplies zero voltage to the bipolar transistors. The bipolar transistor which has received no light remains OFF state. Namely, the ON state of the bipolar transistor into which the light was injected are supported after the injection of the light thereinto was stopped. In the ON state, the bias between the base and the collector becomes almost zero or the base and the collector have almost the same potentials relative to each other. The light injected bipolar transistor therefore takes the saturation state wherein almost no effect of the current gain appears. Since the semiconductor of the base region has a narrower energy band gap than the band gap of the emitter and collector regions, under the saturation state the excess carriers are accumulated in the base region of the light injected transistor. The accumulation of the excess carriers in the base region causes an intrinsic recombination process of electrons and holes. Since the bipolar transistor is made of the semiconductors which have direct band-to-band transition, the above accumulation of the excess carriers causes an intrinsic recombination process by which electrons make a direct band-to-band transition. The above recombination generates photons, or light, and a luminescence or a light emission appears.

The turn-off operation of the light injected bipolar transistor is accomplished by not applying bias to the bipolar transistors to erase the carriers in the ON state bipolar transistor. Although injecting light into the other bipolar transistor in the OFF state is possible for the turn-off operation, it is more preferable to not apply bias to the bipolar transistor in the ON state because a relatively large intensity of the light to be injected into the OFF state bipolar transistor is necessary for the turn-off of the bipolar transistor. The turn-off operation by injecting the light into the bipolar transistor in the OFF state is as follows. When light is injected into the other transistor through its window, the base region of the OFF state bipolar transistor shows an absorption of the lights by which electrons make a direct band-to-band transition for a subsequent generation of electron-hole pairs which will become a base current. The base current causes a collector current which is defined as the product of the base current and the current gain. Since the collector current flows through the resistor between the DC power supply and the collector of the other bipolar transistor, a potential drop appears at the collector of the other bipolar transistor. Since the collector of the other bipolar transistor is electrically connected to the base of the counterpart which has emitted the light, a base voltage of the counterpart is so dropped that the counterpart is switched from ON to OFF state, resulting in a turn-off operation. As a modification, the bias to the bipolar transistors may be dropped to zero before the light is injected into the bipolar transistors so that most of the excess carriers are extracted. This results in both bipolar transistors turning to OFF state prior to the light injection. The bias voltage supplied from the DC power supply is applied to both bipolar transistors when the light is injected thereinto.

When different intensities of lights are concurrently injected into both bipolar transistors, a bipolar transistor which receives a light having a larger intensity than that of the other turns ON and the counterpart which receives a smaller intensity light remains in the OFF state. Also, in this case, the semiconductor optoelectronic switch operates in the positive feedback system. The light is absorbed into the base region of the bipolar transistor and then the absorption of the light causes electrons to make the direct band-to-band transition to thereby generate electrons and holes serving as carriers. Since the bias of the bipolar transistor is concurrent with the light injection, a base current is generated. The high intensity light causes much more base current than the base current generated by the low intensity light. As a result, a collector current of the bipolar transistor receiving the high intensity light is larger than a collector current of the transistor receiving the low intensity light. The bipolar transistor receiving the high intensity light thus shows a larger collector potential drop than a collector potential drop in the bipolar transistor receiving the low intensity light. Since the bases of the bipolar transistors are electrically connected to the collectors of the counterparts thereof respectively, the bipolar transistor receiving the low intensity light shows a larger base potential drop than a base potential drop in the bipolar transistor receiving the high intensity light. Namely, the optoelectronic switch operates in the positive feedback system thereby the bipolar transistor receiving the high intensity light turns ON and the bipolar transistor receiving the low intensity light remains OFF. The reset operation or the switch from the ON to OFF state is accomplished as described above.

Accordingly, a semiconductor optoelectronic switch is obtained which switches into an ON state by receiving a light or a photon for a subsequent luminescence.

It is possible as a modification of the bipolar transistor that both top and end of the bipolar transistor are sandwiched with optical reflective mirrors to form an optical oscillator which allows laser emission in the vertical direction.

Detailed descriptions of the novel semiconductor optoelectronic switch and the driving method thereof will be made in much more detail and concreteness with reference to the accompanying drawings.

A first embodiment according to the present invention will be described. A circuit configuration of the novel optoelectronic switch of the first embodiment according to the present invention will be described with referring to FIG. 2. The novel semiconductor optoelectronic switch includes a pair of double heterostructure bipolar transistors 1 and 2 which are formed on a single semiconductor substrate. The double heterostructure of each of the bipolar transistors 1 and 2 comprises a base layer made of a semiconductor having a smaller energy band gap than those of emitter and collector layers. The bipolar transistor, particularly the base layer, is made of semiconductors which allow electrons to make a direct band-to-band transition, or of direct-gap semiconductors.

The emitters of the first and second bipolar transistors 1 and 2 are both connected to a ground line and the collectors thereof are connected through resistors 3 and 3' to a positive side of a DC power supply 4. The bases of the bipolar transistors 1 and 2 are connected directly to the collectors of the counterparts thereof respectively. Namely, the base of the bipolar transistor 1 is electrically connected directly to the collector of the bipolar transistor 2 and the base of the bipolar transistor 2 is electrically connected directly to the collector of the bipolar transistor 1. As a result, in each of the bipolar transistors, the base and the emitter are biased in the forward direction but the collector and the base are biased in the reverse direction. A resistance value of the resistors 3 and 3' would be determined to adjust an injection current necessary for a luminescence of an ON state bipolar transistor. For example, when the DC power supply 4 supplies a voltage in the range from 3V to 5V and an injection current of approximately 10 mA is necessary for the luminescence of the bipolar transistor, and the resistance value of the resistors 3 and 3' would be few hundred ohms.

Figure 2:
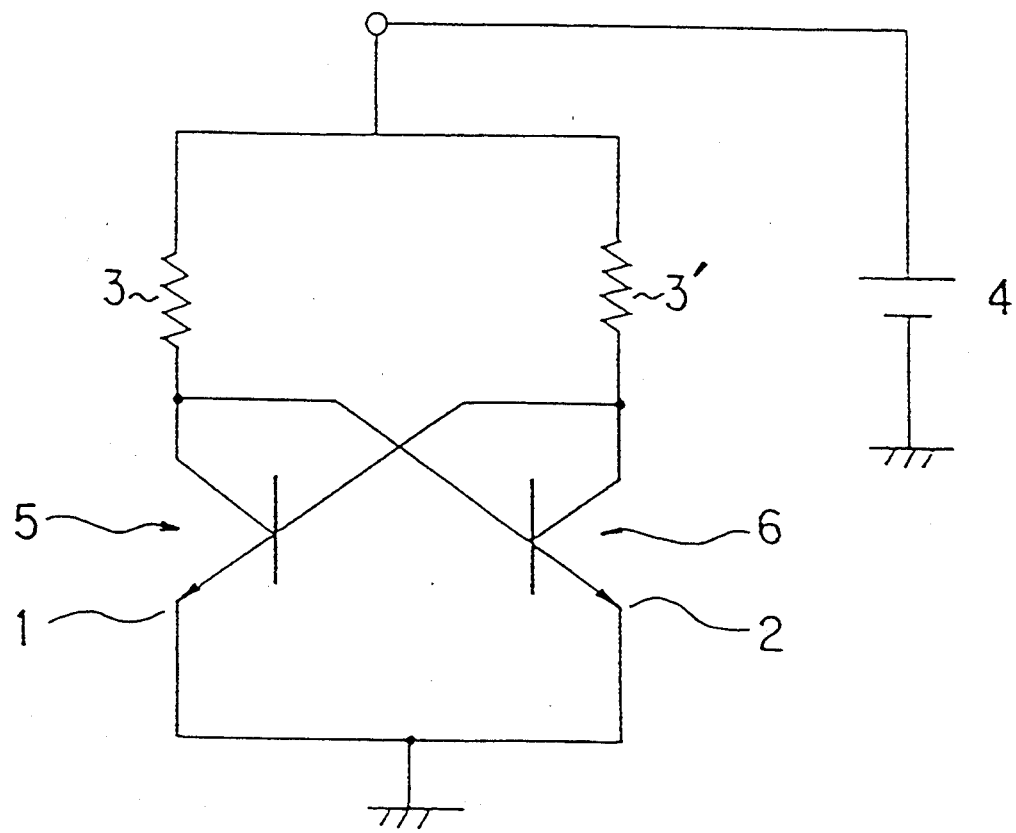
FIG. 2 is a circuit diagram illustrative of circuit configurations of a novel optoelectronic switching device provided by the present invention.

Operations of the novel semiconductor optoelectronic switch will subsequently be described with reference to FIG. 2. Each of the bipolar transistors has a window through which light is injected. The novel semiconductor optoelectronic switch is sensitive to light or photons and then switches from the OFF to the ON state for a subsequent luminescence or light emission. The novel optoelectronic switch is operational when light is injected into either one or both the bipolar transistors. A first description is the case that a light is injected into one bipolar transistor, for example, only the bipolar transistor 2, but not the bipolar transistor 1.

Prior to a light injection into the bipolar transistor, both bipolar transistor are not biased so that the bipolar transistors have almost no excess carriers. A light 6 or a photon is injected to the bipolar transistor 2 through its window and no light is injected into the bipolar transistor 1. At the time, the voltage from the DC power supply 4 is applied to the bipolar transistors 1 and 2 so that both are biased so that emitter and the base are forward-biased but the base and the collector are reverse-biased.

Figure 9:
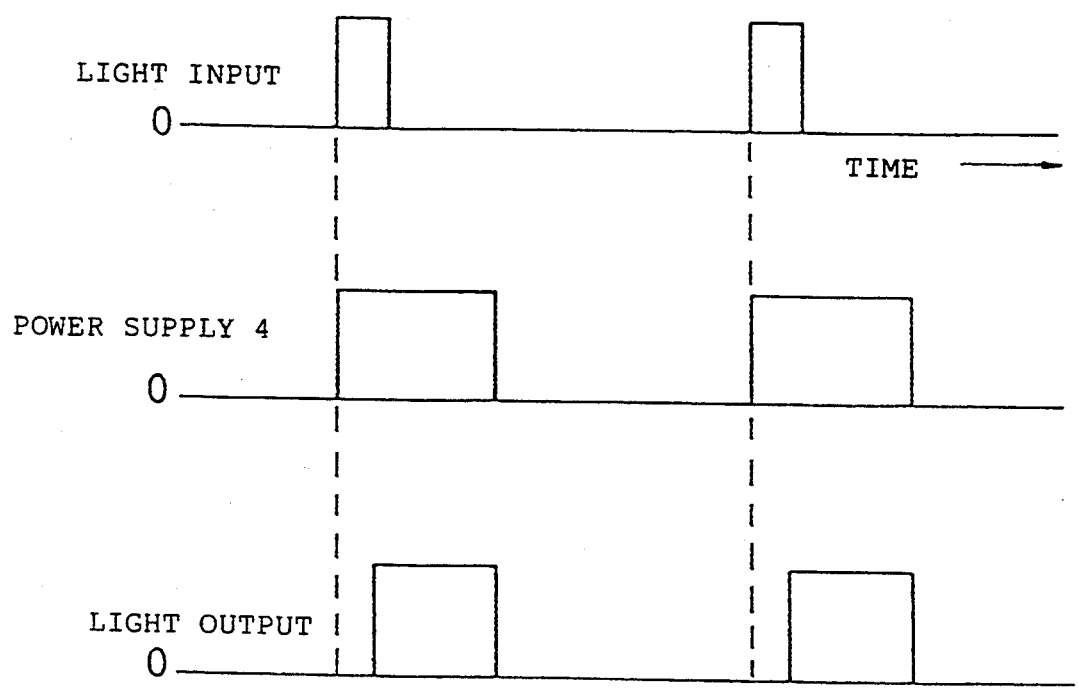
FIG. 9 is a diagram illustrative of a method of driving a novel optoelectronic switching device according to the present invention.

The injected light 6 or photons are absorbed into the base layer of the bipolar transistor 2. The absorption of the light 6 into the base layer causes electrons to make a direct band-to-band transition to thereby generate electrons and holes serving as carriers in the base layer. The bias applied to the bipolar transistor 2 makes the carriers become a base current. The amount of the base current is associated with the intensity of the absorbed lights or the number of absorbed photons. The base current in the bipolar transistor 2 causes a large collector current which is defined by the product of the base current and the current gain of the bipolar transistor 2. The collector current flowing through the resistor 3' makes the resistor 3' consume some of the voltage supplied from the DC power supply in accordance with Ohm's law. As a result, the collector potential of the bipolar transistor 2 is dropped by the amount of the consumed voltage. Since the collector of the bipolar transistor 2 is electrically connected to the base of the bipolar transistor 1, the collector potential drop in the bipolar transistor 2 causes a base potential drop in the bipolar transistor 1. In the bipolar transistor 1, the base potential is dropped to an emitter potential or the ground potential to thereby reduce the forward bias between the emitter and the base. Then, the bipolar transistor 1 is held in the OFF state. Since the collector current of the bipolar transistor 1 is almost zero, there is almost no collector potential drop in the bipolar transistor 1. Namely, the collector of the bipolar transistor 1 has almost the same potential as the positive side of the DC power supply 4. Since the collector of the bipolar transistor 1 is electrically connected to the base of the bipolar transistor 2, the base of the bipolar transistor 2 has a high potential increasingly to thereby support the ON state of the bipolar transistor 2. As a result, a positive feedback system is accomplished in the optoelectronic switch. Namely, when the bipolar transistor 2 receives the light 6 or photons, it turns to the ON state and the bipolar transistor 1 remains in the OFF state. The ON state of the bipolar transistor 2 is supported by the positive feedback system even after the light injection 6 is stopped until no bias is applied to the bipolar transistor 2. In the bipolar transistor 2 in the ON state, the base and the collector have almost the same potential as each other to thereby make the bipolar transistor 2 take on a saturated state in which almost no effect of the current gain is shown. Further, since the base layer has a narrower energy band gap than the energy band gaps of the emitter and collector layers, a majority of the carriers are accumulated in the base layer. Such accumulation of the majority of the carriers causes an intrinsic recombination process by which electrons make a direct band-to-band transition. The above recombination generates photons or light to thereby cause the bipolar transistor 2 to exhibit a luminescence or a light emission. The luminescence or light emission is continued until no bias is applied to the bipolar transistor 2 as shown in FIG. 9.

The turn-off operation is accomplished by applying no bias to the bipolar transistors 1 and 2. A light 5 is injected into the bipolar transistor 1 in the OFF state and is then absorbed into the base layer of the bipolar transistor 1. The excess carriers primary accumulated in the base layer of the bipolar transistor 2 in the ON state are erased by applying no bias to the bipolar transistor 2. The elimination of the excess carriers mainly from the base layer of the bipolar transistor 2 in the ON state stops the recombination process to thereby cause the bipolar transistor 2 to exhibit neither luminescence or light emission. The bipolar transistor 2 thus turns off.

Although injecting a light 5 into the bipolar transistor 1 in the OFF state is available for the turn-off operation of the bipolar transistor 2 in the ON state, it is preferable to apply zero bias to the bipolar transistor 2 because it is necessary to inject a relatively large intensity of the light into the bipolar transistor 1 in the OFF state for the turn-off operation of the bipolar transistor 2.

The turn-off operation of the bipolar transistor 2 by injecting a light thereinto will be described below. The light 5 is injected into the bipolar transistor 1 in the OFF state. Of course, the light 6 is not injected into the bipolar transistor 2 in the ON state. The injected light 5 is absorbed into the base layer of the bipolar transistor 1 in the OFF state. As a result, electrons make the direct band-to-band transition to thereby generate electrons and holes carriers in the base layer of the bipolar transistor 1 in the OFF state for a subsequent generation of a base current of the bipolar transistor 1 which causes a collector current. The collector current of the bipolar transistor 1 causes a collector potential drop. Since the collector of the bipolar transistor 1 is electrically connected to the base of the bipolar transistor 2, the collector potential drop in the bipolar transistor 1 causes a potential drop of the base of the bipolar transistor 2 so that the base potential reaches the same potential as the emitter potential. This results in the bipolar transistor 2 turning off.

The following descriptions relate to the operation of the novel optoelectronic switch in the case wherein lights 5 and 6 are injected into both the bipolar transistors 1 and 2, provided that both injection lights 5 and 6 have different intensities relative to each other. In the following description, it is assumed that the light 6 to be injected into the bipolar transistor 2 has a higher intensity than the intensity of the light 5 to be injected into the bipolar transistor 1.

The lights 5 and 6 are injected into the bipolar transistors 1 and 2 respectively and then absorbed into the base layers thereof. The absorptions of the lights 5 and 6 cause electrons to make the direct band-to-band transitions to thereby generate electrons and holes serving as carriers in the base layers of the bipolar transistors 1 and 2 respectively. Then the generated carriers become the base current. The number of the generated electrons and holes is associated with the intensity of the absorbed light or the number of absorbed photons. The amount of base current is associated with the number of the generated electrons and holes serving as carriers. Thus the base current of the bipolar transistor 2 is larger than the base current of the bipolar transistor 1. The respective base currents in the bipolar transistors 1 and 2 cause collector currents defined by the product of the base currents and the current gain. Thus, the collector current in the bipolar transistor 2 is larger than the collector current of the bipolar transistor 1. The collector currents flowing through the resistor 3 and 3' cause collector potential drops due to the voltage consumption in the resistors 3 and 3'. The amount of the potential drop at the collectors of the bipolar transistor is almost proportional to the amount of the collector current. Hence, the amount of the collector potential drop in the bipolar transistor 2 is larger than the collector potential drop in the bipolar transistor 1. Namely, the collector potential of the bipolar transistor 2 is higher than the collector potential of the bipolar transistor 1. Since the respective collectors of the bipolar transistors 1 and 2 are connected directly to the bases of the counterpart thereof, the base potential of the bipolar transistor 1 becomes lower than the base potential of the bipolar transistor 2. The forward bias between the base and the emitter in the bipolar transistor 1 is reduced much more than the reduction of that in the bipolar transistor 2. The reduction of the forward bias reduces the collector current. Since the amount of the reduction of the collector current is associated with the amount of the potential drop of the base, the reduction of the collector current in the bipolar transistor 1 is larger than the reduction of the collector current in the bipolar transistor 2. This makes the collector potential in the bipolar transistor 1 rise but lowers the collector potential in the bipolar transistor 2 to thereby drop the base potential of the bipolar transistor 1 and the base potential of the bipolar transistor 2 rise increasingly. As a result, the positive feedback system is so accomplished that the bipolar transistor 2 turns ON and the bipolar transistor 1 remains OFF. Accordingly, the positive feedback system makes the bipolar transistor which has received the high intensity light turn ON and the counterpart which has received the low intensity light remain OFF state.

The reset operation of the novel optoelectronic switch is the same as the above description.

A structure of the bipolar transistor used in the novel optoelectronic switch of the first embodiment according to the present invention will subsequently be described with reference to FIGS. 3 and 5.

Figure 3:
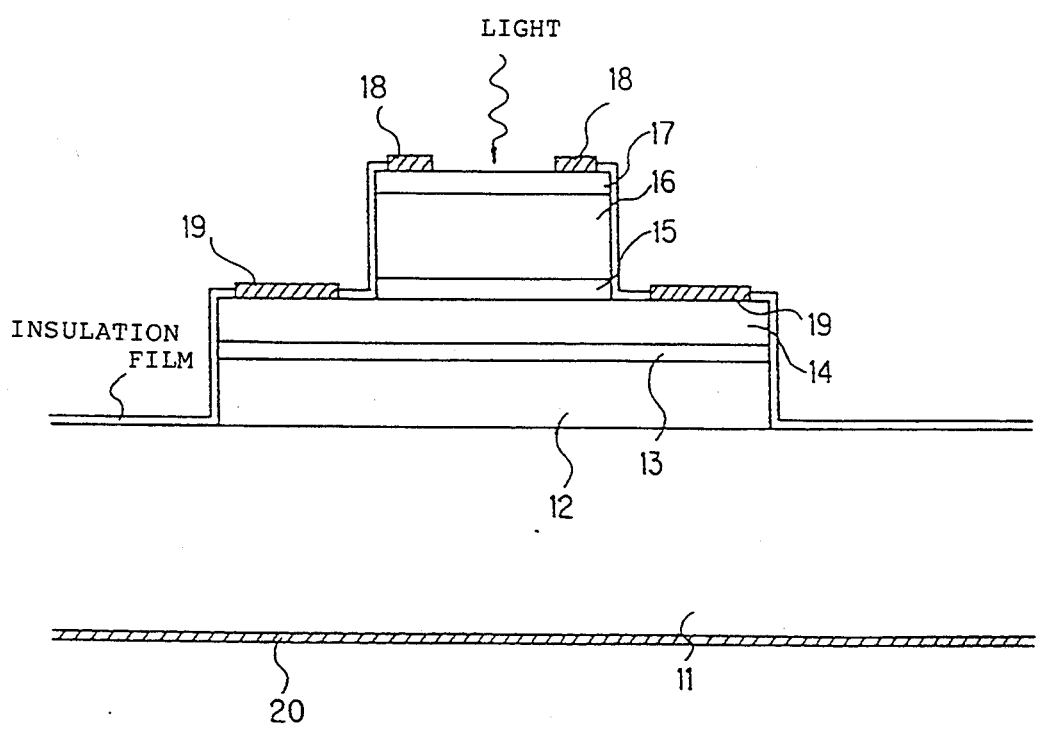
FIG. 3 is a fragmentary cross sectional elevation view illustrative of a novel optoelectronic switching device in a first embodiment according to the present invention.

FIG. 3 illustrates a novel structure of one of the bipolar transistors 1 and 2 employed in the novel optoelectronic switch in the first embodiment according to the present invention. The pair of bipolar transistors 1 and 2 illustrated in FIG. 2 is formed on a single semiconductor substrate. The following description refers to npn bipolar transistors, although pnp bipolar transistors may also be used in the novel optoelectronic switch.

A novel npn bipolar transistor employed in the optoelectronic switch is formed on a substrate 11 made of n-GaAs. An n-Al$_{0.4}$Ga$_{0.6}$As layer 12 having a thickness of approximately 400 nanometers and a dopant concentration of approximately $1 \times 10^{18}$ cm$^{-3}$ is formed on the n-GaAs substrate 11. An n-AlGaAs graded layer 13 having a thickness of approximately 20 nanometers and a dopant concentration of approximately $1 \times 10^{18}$ cm$^{-3}$ is formed on the n-Al$_{0.4}$Ga$_{0.6}$As layer 12. The fraction of aluminum in the n-AlGaAs graded layer 13 is graded from 0.4 at the interface to the n-Al$_{0.4}$Ga$_{0.6}$As layer 12 to 0 at the opposite surface. A p-GaAs layer 14 having a thickness of approximately 100 nanometers and a dopant concentration of approximately $2 \times 10^{18}$ cm$^{-3}$ is formed on the n-AlGaAs graded layer 13. An n-AlGaAs graded layer 15 having a thickness of approximately 20 nanometers and a dopant concentration of approximately $1 \times 10^{17}$ cm$^{-3}$ is formed on the p-GaAs layer 14. The fraction of aluminum in the n-AlGaAs graded layer 15 is graded from 0 at the interface to the p-GaAs layer 14 to 0.4 at the opposite surface. An n-Al$_{0.4}$Ga$_{0.6}$As layer 16 having a thickness of approximately 400 nanometers and a dopant concentration of approximately $1 \times 10^{17}$ cm$^{-3}$ is formed on the n-AlGaAs graded layer 15. An n-GaAs layer 17 having a thickness of approximately 100 nanometers and a dopant concentration of approximately $2 \times 10^{18}$ cm$^{-3}$ is formed on the n-Al$_{0.4}$Ga$_{0.6}$As layer 16.

The n-Al$_{0.4}$Ga$_{0.6}$As layer 12 serves as an emitter layer in the bipolar transistor. The p-GaAs layer 14 serves as a base layer. The n-Al$_{0.4}$Ga$_{0.6}$As layer 16 serves as a collector layer. The semiconductor n-Al$_{0.4}$Ga$_{0.6}$As has a wider energy band gap than an energy band gap of the semiconductor GaAs. Thus, the p-GaAs base layer 14 has a narrower energy band gap than an energy band gap of either the n-Al$_{0.4}$Ga$_{0.6}$As collector layer 16 or the n-Al$_{0.4}$Ga$_{0.6}$As emitter layer 12. The AlGaAs graded layers 13 and 15 are inserted both between the emitter and base layers 12 and 14 and between the base and collector layers 14 and 16 respectively in order to prevent any potential barrier due to the energy band gap discontinuity between AlGaAs and GaAs from appearing at interfaces of the p-GaAs base layer 14 and the n-Al$_{0.4}$Ga$_{0.6}$As emitter and collector layers 12 and 16.

The n-GaAs layer 17 serves as a contact layer on which a collector electrode 18 is formed. The collector electrode has a window through which lights or photons are injected into the bipolar transistor. The n-AlGaAs graded layer 15, the n-Al$_{0.4}$Ga$_{0.6}$As collector layer 16 and the n-GaAs contact layer 17 are defined by etching after which a base electrode 19 is formed on a base layer surface exposed by the above etching. The base and emitter layers 14 and 12 and the graded layer 13 are also defined by etching. An emitter electrode 20 which is connected directly to a ground line is formed on an opposite surface of the substrate 11 to the emitter layer 12 so as to allow the above emitter electrode 20 to serve as a common emitter electrode with a counterpart of the illustrated bipolar transistor. Am insulation film is formed on an entire surface of the bipolar transistor, but for the respective emitter, collector and base electrodes, 20, 18, and 19 and the window.

The AlGaAs graded layers 13 and 15 provide a sloped energy band profile free from any potential barrier like the energy band discontinuity. Such sloped energy band profile permits carriers such as electrons to move rapidly across the opposite interfaces of the base layer 14. This permits the bipolar transistor to possess a high speed performance for a high speed switching operation of the novel semiconductor optoelectronic switch.

The p-GaAs base layer 14 has a narrower band gap than that of the n-Al$_{0.4}$Ga$_{0.6}$As emitter and collector layers 12 and 16 sandwiching the base layer 14 so that in the saturated state where the bipolar transistor shows almost no current gain effect, the excess carriers are accumulated in the base layer 14. This causes an intrinsic recombination process by which electrons make a direct band-to-band transition. The recombination process causes a luminescence and a light emission.

As described above and illustrated in FIG. 3, the novel bipolar transistor without any additional electrode or additional element is able to exhibit a simple structure suitable for the integration thereof into the two-dimensional arrays.

Figure 5:
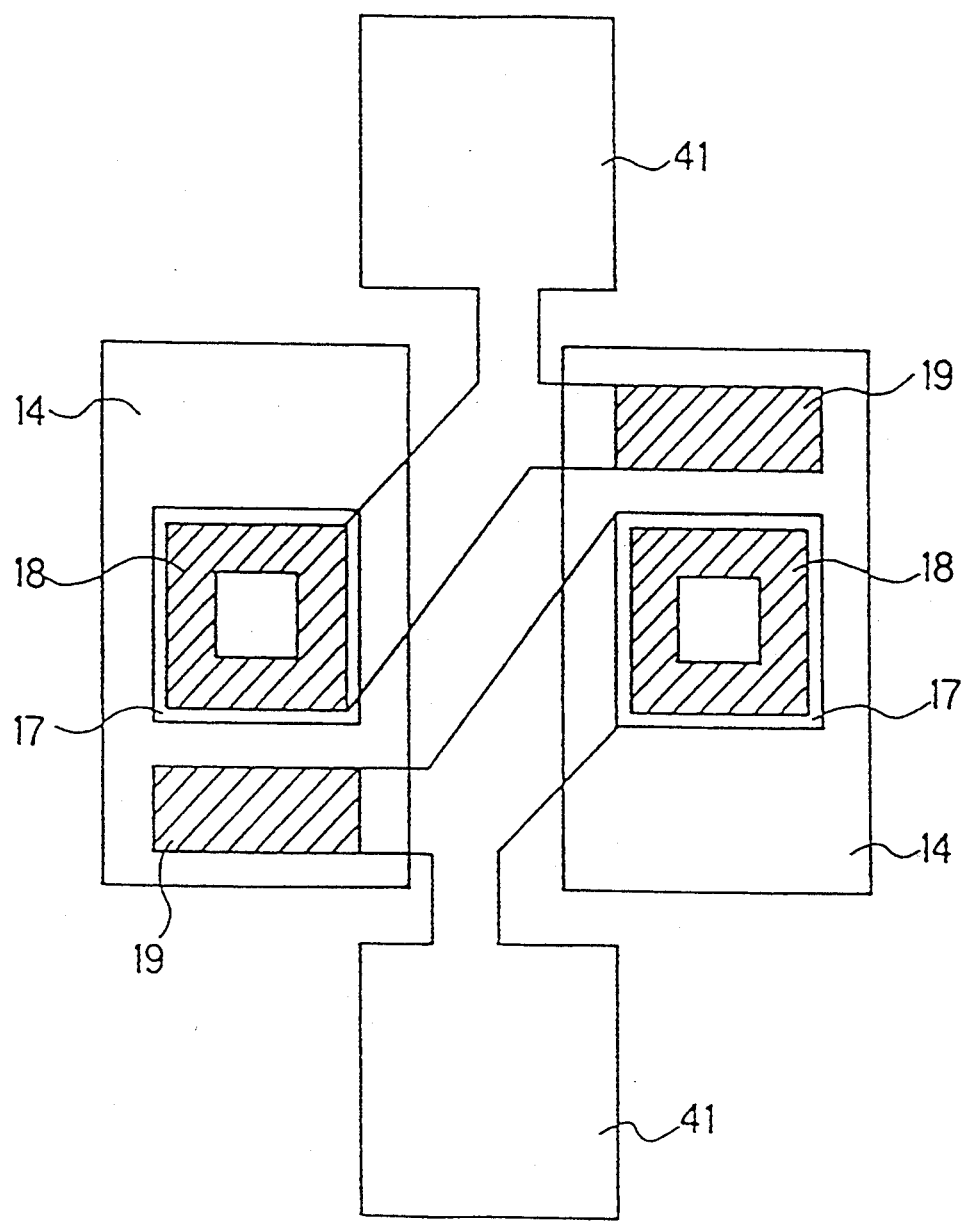
FIG. 5 is a plane view illustrative of the novel optoelectronic switching device in the first embodiment according to the present invention.

FIG. 5 illustrates a circuit connection of the pair of the bipolar transistors from which it is understood that the two base electrodes 19 of the bipolar transistors are connected through wirings to the collector electrodes of the counterparts thereof. Each of the wirings are connected to a pad 41 through which each of the wiring is connected to an external resistor.

A second embodiment of the present invention will subsequently be described in detail with reference to FIG. 4. A novel optoelectronic switch according to a second embodiment of the present invention has the same circuit configuration as that illustrated in FIG. 2 in the first embodiment according to the present invention. The novel optoelectronic switch of the second embodiment according to the present invention has an analogous operation to that of the first embodiment. A difference between the first and second embodiments according to the present invention is in a structure of the bipolar transistor employed in the novel optoelectronic switch. The structure of the bipolar transistor in the second embodiment according to the present invention will be described below. The following description refers to npn bipolar transistors, although pnp bipolar transistors may also be used in the novel optoelectronic switch.

Figure 4:
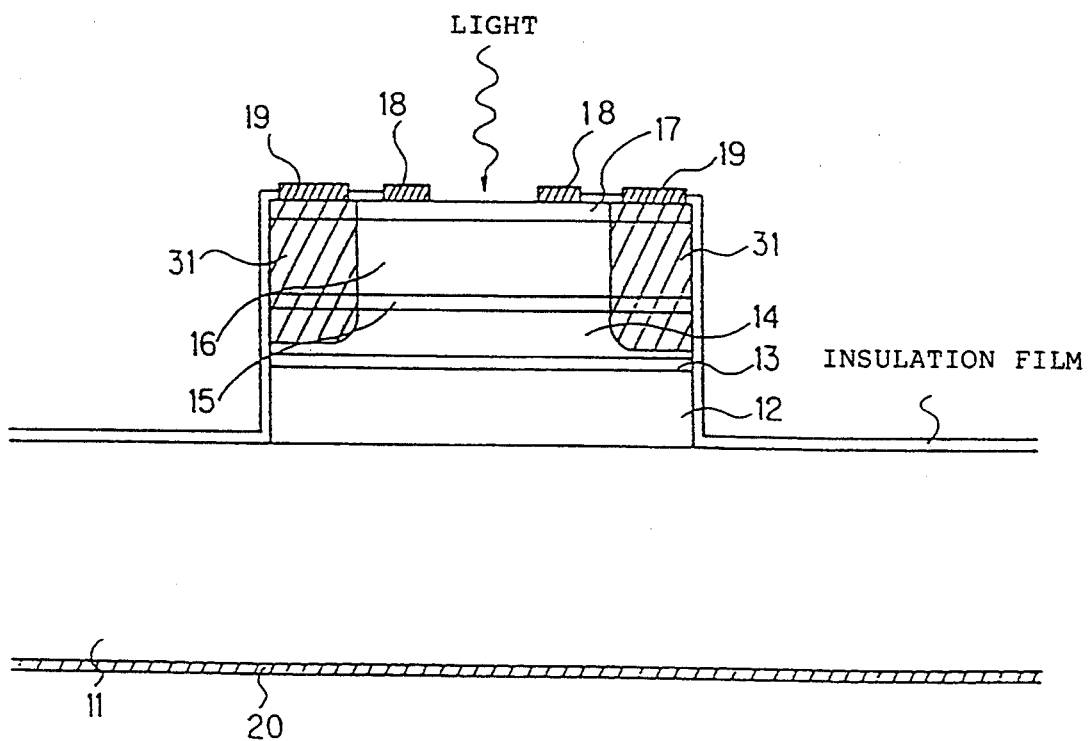
FIG. 4 is a fragmentary cross sectional elevation view illustrative of a novel optoelectronic switching device in a second embodiment according to the present invention.

FIG. 4 illustrates a novel structure of one of the bipolar transistors 1 and 2 employed in the novel optoelectronic switch in the second embodiment according to the present invention. The bipolar transistor of the second embodiment has a simple structure which is realized by providing not only the collector electrode but also the base electrode on a flat upper surface of the bipolar transistor. The pair of the bipolar transistors 1 and 2 illustrated in FIG. 2 are formed on a single semiconductor substrate.

A novel npn bipolar transistor employed in the optoelectronic switch is formed on a substrate 11 made of n-GaAs. A n-Al$_{0.4}$Ga$_{0.6}$As layer 12 having a thickness of approximately 400 nanometers and a dopant concentration of approximately $1 \times 10^{18}$ cm$^{-3}$ is formed on the n-GaAs substrate 11. An n-AlGaAs graded layer 13 having a thickness of approximately 20 nanometers and a dopant concentration of approximately $1 \times 10^{18}$ cm$^{-3}$ is formed on the n-Al$_{0.4}$Ga$_{0.6}$As layer 12. The fraction of aluminum in the n-AlGaAs graded layer 13 is graded from 0.4 at the interface to the n-Al$_{0.4}$Ga$_{0.6}$As layer 12 to 0 at the opposite surface. A p-GaAs layer 14 having a thickness of approximately 100 nanometers and a dopant concentration of approximately $2 \times 10^{18}$ cm$^{-3}$ is formed on the n-AlGaAs graded layer 13. An n-AlGaAs graded layer 15 having a thickness of approximately 20 nanometers and a dopant concentration of approximately $1 \times 10^{17}$ cm$^{-3}$ is formed on the p-GaAs layer 14. The fraction of aluminum in the n-AlGaAs graded layer 15 is graded from 0 at the interface to the p-GaAs layer 14 to 0.4 at the opposite surface. An n-Al$_{0.4}$Ga$_{0.6}$As layer 16 having a thickness of approximately 400 nanometers and a dopant concentration of approximately $1 \times 10^{17}$ cm$^{-3}$ is formed on the n-AlGaAs graded layer 15. An n-GaAs layer 17 having a thickness of approximately 100 nanometers and a dopant concentration of approximately $2 \times 10^{18}$ cm$^{-3}$ is formed on the n-Al$_{0.4}$Ga$_{0.6}$As layer 16.

A p-type diffusion region 31 is formed by either a diffusion method or an ion-implantation to extend through the n-GaAs layer 17, the n-Al$_{0.4}$Ga$_{0.6}$As layer 16 and the AlGaAs graded layer 15 to the p-GaAs base layer 14.

The n-Al$_{0.4}$Ga$_{0.6}$As layer 12 serves as an emitter layer in the bipolar transistor. The p-GaAs layer 14 serves as a base layer. The n-Al$_{0.4}$Ga$_{0.6}$As layer 16 serves as a collector layer.

The n-GaAs layer 17 serves as a contact layer on which a collector electrode 18 is formed. The collector electrode has a window through which light or photons are injected into the bipolar transistor. A base electrode 19 is formed on an exposed surface of the p-type diffusion layer 31 so that the base electrode 19 and the base layer 14 are electrically connected through the p-type diffusion region 31. An emitter electrode 20 which is connected directly to a ground line is formed on an opposite surface of the substrate 11 to the emitter layer 12 so as to allow the above emitter electrode 20 to serve as a common emitter electrode with a counterpart of the illustrated bipolar transistor. An insulation film is formed on an entire surface of the bipolar transistor, but for the respective emitter, collector and base electrodes 20, 18 and 19 and the window.

Both the collector and emitter electrodes 18 and 19 are formed on a flat upper surface of the bipolar transistor, namely both on the n-GaAs contact layer 17 and on the p-type diffusion region 31 so that a more simple structure of the bipolar transistor is obtained, which is more suitable for an integration into the two-dimensional arrays.

The AlGaAs graded layers 13 and 15 provide a sloped energy band profile free from any potential barrier like the energy band discontinuity. The sloped energy band profile permits carriers such as electrons to move rapidly across the opposite interfaces of the base layer 14. This permits the bipolar transistor to possess a high speed performance for a high speed switching operation of the novel semiconductor optoelectronic switch.

The p-GaAs base layer 14 has a narrower band gap than that of the n-Al$_{0.4}$Ga$_{0.6}$As emitter and collector layers 12 and 16 sandwiching the base layer 14 so that in the saturated state where the bipolar transistor shows almost no current gain effect, the excess carriers are accumulated in the base layer 14. This causes an intrinsic recombination process by which electrons make the direct band-to-band transition. The recombination process causes a luminescence and a light emission.

As described above and illustrated in FIG. 4, the novel bipolar transistor has no additional electrodes nor additional elements to obtain a simple structure suitable for integration into two-dimensional arrays.

A third embodiment of the present invention will subsequently be described in detail with reference to FIG. 6. A novel optoelectronic switch in the third embodiment according to the present invention has the same circuit configuration as that illustrated in FIG. 2 in the first embodiment according to the present invention. The novel optoelectronic switch of the third embodiment according to the present invention exhibits an operation analogous to that of the first embodiment. The difference between the first and third embodiments according to the present invention is in the structure of the bipolar transistor employed in the novel optoelectronic switch. The structure of the bipolar transistor in the third embodiment is different from that the first embodiment in that providing reflecting mirrors we provided at the top and bottom of the bipolar transistor for laser emission. The structure of the bipolar transistor in the third embodiment according to the present invention will be described below. The following description refers to npn bipolar transistors, although pnp bipolar transistors may also be used in the novel optoelectronic switch.

Figure 6:
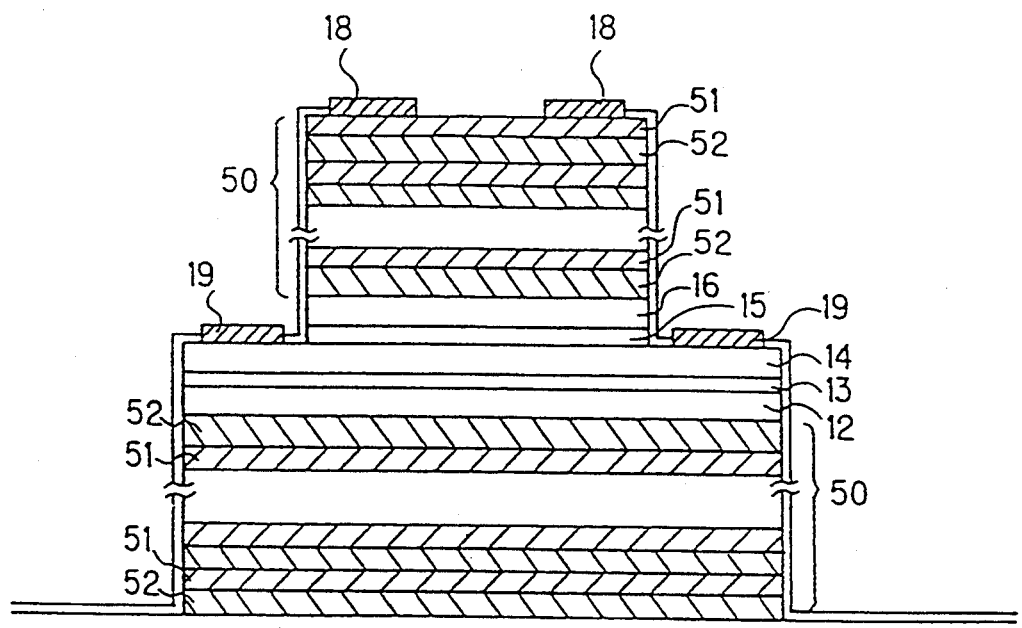
FIG. 6 is a fragmentary cross sectional elevation view illustrative of a novel optoelectronic switching device in a third embodiment according to the present invention.
Figure 6:
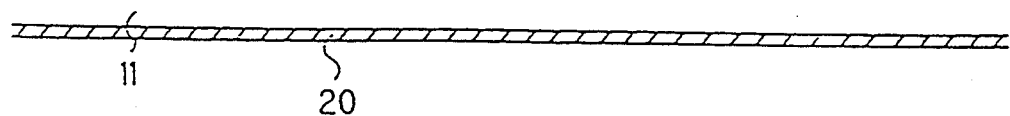

FIG. 6 illustrates a novel structure of one of the bipolar transistors 1 and 2 employed in the novel optoelectronic switch in the third embodiment according to the present invention. The structure of the bipolar transistor of the third embodiment is different from that of the first embodiment in that semiconductor multi-layer reflecting mirrors 50 and 50' are provided at top and bottom of the bipolar transistor for laser emission. The pair of bipolar transistors 1 and 2 illustrated in FIG. 2 are formed on a single semiconductor substrate.

The novel npn bipolar transistor employed in the optoelectronic switch is formed on a substrate 11 made of n-GaAs. A first semiconductor multi-layer reflecting mirror 50 is formed in the n-GaAs substrate 11. The first semiconductor multi-layer reflecting mirror 50 comprises laminations of alternating n-AlGaAs layers 51 and n-AlAs layers 52. An n-Al$_{0.4}$Ga$_{0.6}$As layer 12 having a thickness of approximately 400 nanometers and a dopant concentration of approximately $1 \times 10^{18}$ cm$^{-3}$ is formed on the semiconductor multi-layer reflecting mirror 50. An n-AlGaAs graded layer 13 having a thickness of approximately 20 nanometers and a dopant concentration of approximately $1 \times 10^{18}$ cm$^{-3}$ is formed on the n-Al$_{0.4}$Ga$_{0.6}$As layer 12. The fraction of aluminum in the n-AlGaAs graded layer 13 is graded from 0.4 at the interface to the n-Al$_{0.4}$Ga$_{0.6}$As layer 12 to 0 at the opposite surface. A p-GaAs layer 14 having a thickness of approximately 100 nanometers and a dopant concentration of approximately $2 \times 10^{18}$ cm$^{-3}$ is formed on the n-AlGaAs graded layer 13. An n-AlGaAs graded layer 15 having a thickness of approximately 20 nanometers and a dopant concentration of approximately $1 \times 10^{17}$ cm$^{-3}$ is formed on the p-GaAs layer 14. The fraction of aluminum in the n-AlGaAs graded layer 15 is graded from 0 at the interface to the p-GaAs layer 14 to 0.4 at the opposite surface. An n-Al$_{0.4}$Ga$_{0.6}$As layer 16 having a thickness of approximately 400 nanometers and a dopant concentration of approximately $1 \times 10^{17}$ cm$^{-3}$ is formed on the n-AlGaAs graded layer 15. A second semiconductor multi-layer reflecting mirror 50' is formed on the n-Al$_{0.4}$Ga$_{0.6}$As layer 16. The second semiconductor multi-layer reflecting mirror 50 comprises laminations of alternating the n-AlGaAs layers 51 and the n-AlAs layers 52.

The n-Al$_{0.4}$Ga$_{0.6}$As layer 12 serves as an emitter layer in the bipolar transistor. The p-GaAs layer 14 and n-Al$_{0.4}$Ga$_{0.6}$As layer 16 serve as base and collector layers respectively.

A collector electrode 18 is formed on a top of the second semiconductor reflecting mirror 50'. The collector electrode 18 has a window through which light or photons are injected into the bipolar transistor. A base electrode 19 is formed on the base layer 14. An emitter electrode 20 which is connected directly to a ground line is formed on an opposite surface of the substrate 1 to the emitter layer 12 so as to allow the above emitter electrode 20 to serve as a common emitter electrode with a counterpart of the illustrated bipolar transistor. An insulation film is formed on an entire surface of the bipolar transistor, but for the respective emitter, collector and base electrodes 20, 18 and 19 and the window.

With respect to the structure of the first and second multi-layer reflecting mirrors 50 and 50', the bipolar transistor is sandwiched by the first and second semiconductor multi-layer reflecting mirrors 50 and 50' to form an optical oscillator. Each of the n-AlGaAs layer 51 and the n-AlAs 52 has a thickness which is a quarter of a wavelength of a light to be emitted from the bipolar transistor. The total thickness of the layers constituting the bipolar transistor is designed as to be twice as thick as the wavelength light to be emitted from the bipolar transistor. The base layer is positioned at a half-position in the bipolar transistor to obtain maximum efficiencies of the absorption and emission of the light. As modifications, the total thickness of the layers constituting the bipolar transistor may be determined by multiplying a half of a wavelength of the light to be emitted from the bipolar transistor by an integer. It is possible that the base layer could be positioned at an antinode of a standing wave of the light between the first and second semiconductor multi-layer reflecting mirrors so as to obtain maximum efficiencies of the absorption and emission of the light.

The n-AlGaAs graded layers 13 and 15 provide a sloped energy band profile free from any potential barrier like the energy band discontinuity. Such a sloped energy band profile permits carriers such as electrons to move rapidly across the opposite interfaces of the base layer 14. This permits the bipolar transistor to possess a high speed performance for a high speed switching operation of the novel semiconductor optoelectronic switch.

The p-GaAs base layer 14 has a narrower band gap than that of the n-Al$_{0.4}$Ga$_{0.6}$As emitter and collector layers 12 and 16 sandwiching the base layer 14 so that in the saturated state where the bipolar transistor shows almost no current gain effect, the excess carriers are accumulated in the base layer 14. This causes an intrinsic recombination process by which electrons make a direct band-to-band transition. The recombination process causes a luminescence and a light emission.

As described above and illustrated in FIG. 6, the novel bipolar transistor has no additional electrodes nor additional elements to obtain a simple structure suitable for integration into two-dimensional arrays.

Figure 7A:
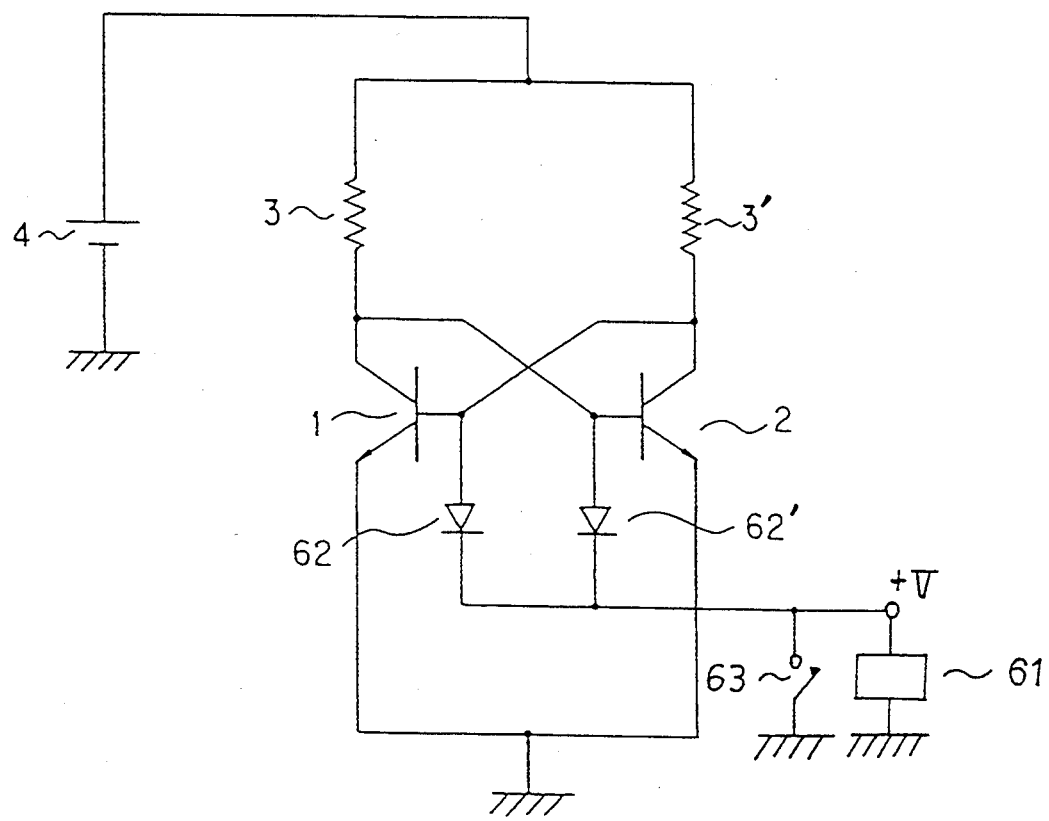
FIG. 7A is a circuit diagram illustrative of circuit configurations of a novel optoelectronic switching device in a fourth embodiment according to the present invention.

A fourth embodiment of the present invention will subsequently be described in detail with reference to FIG. 7A. A novel optoelectronic switch according to the fourth embodiment of the present invention has a different circuit configuration from that illustrated in FIG. 2 in the first embodiment according to the present invention. The novel optoelectronic switch of the fourth embodiment has a pair of diodes and a secondary DC power supply to extract excess charges in base layers of bipolar transistors employed in the optoelectronic switch for a reset operation. The novel optoelectronic switch of the fourth embodiment according to the present invention has a different reset operation from that of the first embodiment. Each of the bipolar transistors in the optoelectronic switch of the fourth embodiment according to the present invention has a different structure from that of the first embodiment. The structure of the bipolar transistor in the fourth embodiment according to the present invention will be described below.

The novel semiconductor optoelectronic switch includes a pair of first and second bipolar transistors 1 and 2 which are formed on a single semiconductor substrate. Each of the bipolar transistors 1 and 2 has a double heterostructure which comprises a base layer made of a semiconductor having a smaller energy band gap than the band-gap of emitter and collector layers.

The emitters of the first and second bipolar transistors 1 and 2 are both connected to a ground line. The collectors of the first and second bipolar transistors 1 and 2 are connected to a ground line and the collectors thereof are connected through resistors 3 and 3' to a plus side of a first DC power supply 4. The bases of the first and second bipolar transistors 1 and 2 are connected directly to the collectors of the counterparts thereof. Namely, the bases of the first and second bipolar transistors 1 and 2 are electrically connected directly to the collectors of the second and first bipolar transistors 2 and 1 respectively. Therefore, in each of the first and second bipolar transistors 1 and 2 the base and the emitter are forward-biased, but the collector and the base are reverse-biased.

The bases of the first and second bipolar transistors 1 and 2 are connected through first and second diodes 62 and 62' to a positive side of a DC power supply 61. The bases of the first and second bipolar transistors 1 and 2 are also connected through a switch 63 to a ground line. The switch 63 may comprise a transistor such as a MOS transistor. The first and second diodes 62 and 62' are connected to the DC power supply 61 in the reverse direction. Namely, cathodes of the first and second diodes 62 and 62' are connected to the positive side of the DC power supply and anodes thereof are connected directly to the bases of the first and second bipolar transistors 1 and 2.

When the switch 63 turns OFF, a positive voltage is applied to the cathodes of the first and second diodes 62 and 62' to thereby bias them in the reverse direction. As a result, the bases of the bipolar transistors 1 and 2 are disconnected from the ground line. In this status, the circuit configuration of the optoelectronic switch may be regarded as the same as that of the first embodiment illustrated in FIG. 2.

If the switch 63 turns ON, the cathode of the diodes 62 and 62' are connected to the ground line to thereby forward bias the diodes 62 and 62'. As a result, the bases of the first and second bipolar transistors 1 and 2 may be regarded as being connected to the ground line and, as a result, the bases thereof have the ground potential.

The operation of the optoelectronic switch of the fourth embodiment is different from that of the first embodiment in its reset operation, but is analogous in the light injection and emission.

When a light is injected into the bipolar transistors 1 and 2, the switch 63 turns OFF to thereby apply a positive voltage from the DC power supply to the cathodes of the diodes 62 and 62', namely the diodes 1 and 2 are reverse-biased. As a result, the bases of the bipolar transistors 1 and 2 may be regarded as being electrically disconnected from the diodes 62 and 62'. Then, the circuit configuration in this state may be regarded as being the same as that illustrated in FIG. 2 in the first embodiment according to the present invention. Therefore, one of the bipolar transistors 1 and 2, which receives light, turns ON and the other receiving no light or a light having a lower intensity turns OFF by the effect of positive feedback. The one of the bipolar transistors 1 and 2 in the ON state then shows a light emission until either the DC power supply 4 supplies zero voltage to the optoelectronic switch or the switch turns ON, whichever occurs first. In this embodiment, the DC power supply 4 continues to supply the positive voltage not only in the optical switching operation but also in the reset operation.

When the switch turns ON, a reset operation of the optoelectronic switch is initiated for a subsequent optical switching operation. The switch 63 turns ON to thereby electrically connect the cathodes of the diodes 62 and 62' to the ground line through the switch 63 in the ON state. As a result, the diodes 62 and 62' are forward-biased and then excess carriers in the base layers of the bipolar transistors 1 and 2 are extracted through the diodes 62 and 62' until the base layers have almost the ground potential. After most of the excess carriers in the base layers of the first and second bipolar transistors 1 and 2 are extracted through the diodes 62 and 62', the reset operation is completed for a subsequent optical switching operation.

Figure 7B:
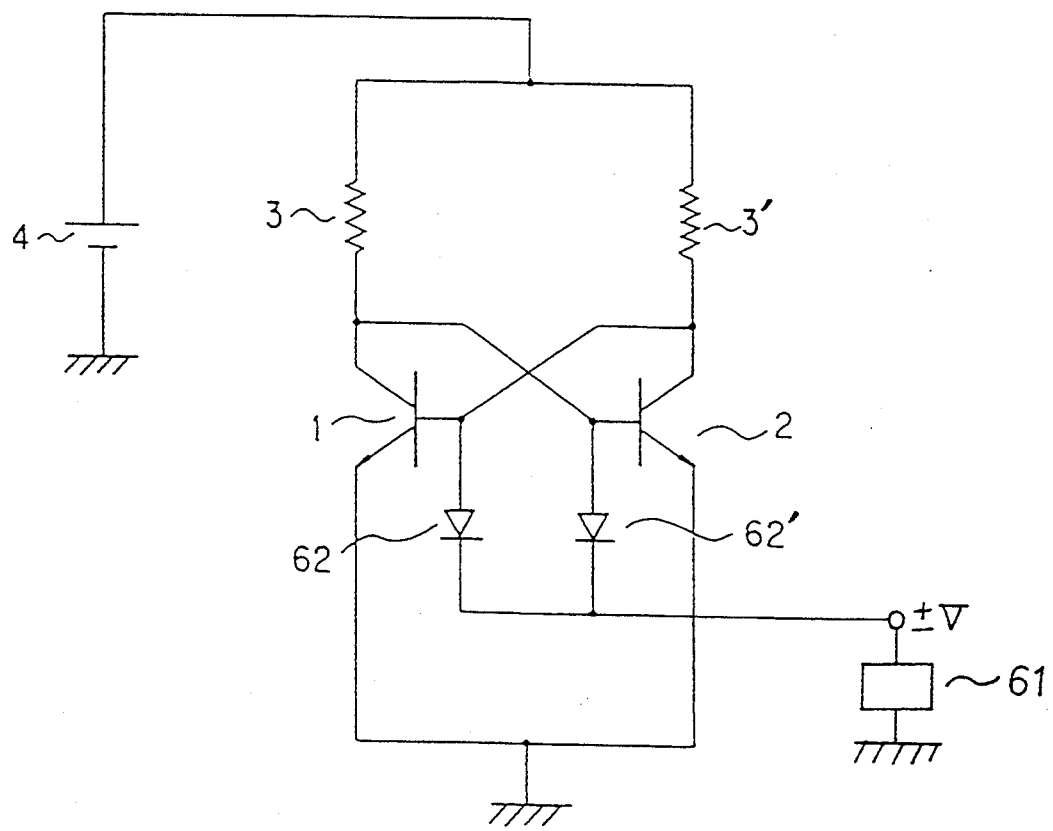
FIG. 7B is a circuit diagram illustrative of circuit configurations of a novel optoelectronic switching device in a fifth embodiment according to the present invention.
Figure 10:
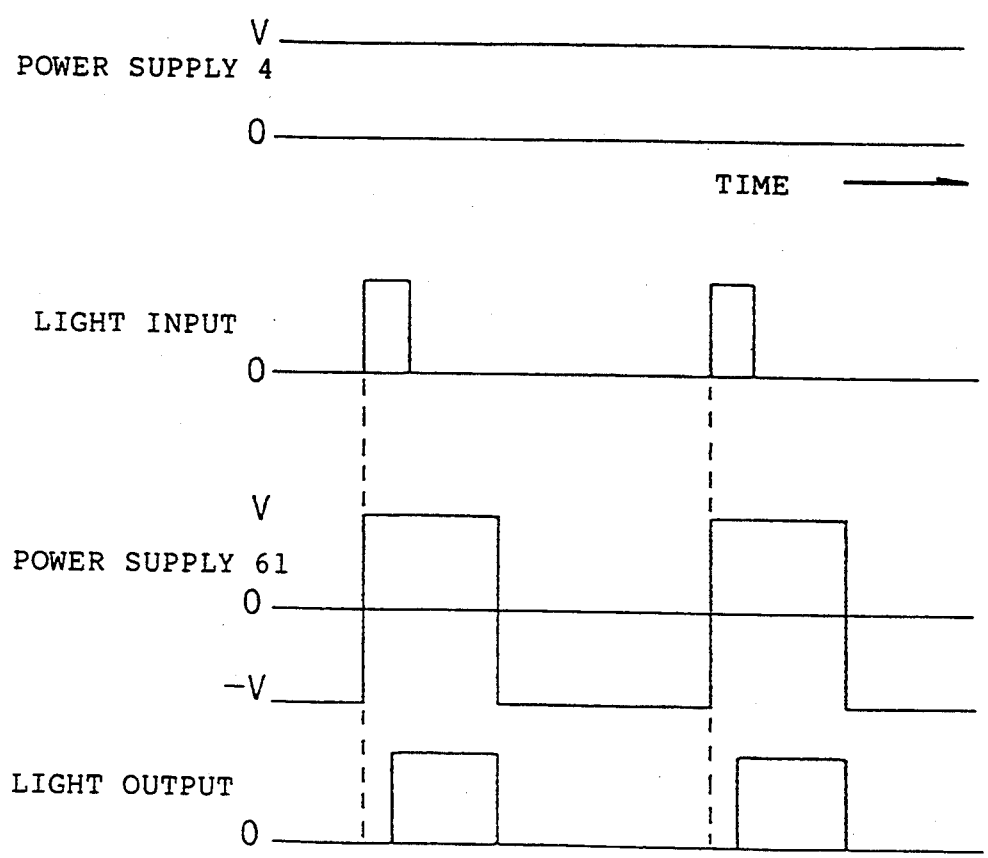
FIG. 10 is a diagram illustrative of another method of driving a novel optoelectronic switching device according to the present invention.

A fifth embodiment of the present invention will subsequently be described in detail with reference to FIGS. 7B, 8 and 10. A novel optoelectronic switch in the fifth embodiment according to the present invention has a different circuit configuration only in the presence of a secondary DC power supply to drive diodes from that illustrated in FIG. 7A in the fourth embodiment according to the present invention. The novel optoelectronic switch of the fifth embodiment has a pair of diodes and a secondary DC power supply to extract excess charges in base layers of bipolar transistors employed in the optoelectronic switch for a reset operation. The novel optoelectronic switch of the fifth embodiment according to the present invention has a different reset operation from that of the first embodiment. Each of the bipolar transistors in the optoelectronic switch of the fifth embodiment according to the present invention has a different structure from that of the first embodiment. The structure of the bipolar transistor in the fifth embodiment according to the present invention will be described below with referring to FIG. 7B.

A novel semiconductor optoelectronic switch includes a pair of first and second bipolar transistors 1 and 2 which are formed on a single semiconductor substrate. Each of the bipolar transistors 1 and 2 has a double heterostructure which comprises a base layer made of a semiconductor having a smaller energy band gap than those of emitter and collector layers.

The emitters of the first and second bipolar transistors 1 and 2 are in common connected to a ground line. The collectors of the first and second bipolar transistors 1 and 2 are connected to a ground line and the collectors thereof are connected through resistors 3 and 3' to a plus side of a first DC power supply 4. The bases of the first and second bipolar transistors 1 and 2 are connected directly to the collectors of the counterparts thereof. Namely, the bases of the first and second bipolar transistors 1 and 2 are electrically connected directly to the collectors of the second and first bipolar transistors 2 and 1 respectively. Therefore, in each of the first and second bipolar transistors 1 and 2 the base and the emitter are forward-biased, but the collector and the base are reverse-biased.

The bases of the first and second bipolar transistors 1 and 2 are connected through first and second diodes 62 and 62' to a secondary DC power supply 61 which is able to supply positive and negative voltages. The DC power supply 63 may comprise a CMOS circuit and positive and negative DC power supplies.

When the DC power supply 61 supplies a positive voltage +V, the positive voltage +V is applied to the cathodes of the first and second diodes 62 and 62' to thereby bias them in the reverse direction. As a result, the bases of the bipolar transistors 1 and 2 are disconnected from the ground line. In this status, the circuit configuration of the optoelectronic switch may be regarded as the same as that of the first embodiment illustrated in FIG. 2.

If the DC power supply 61 supplies an negative voltage −V, the negative voltage −V is applied to the cathodes of the first and second diodes 62 and 62' to thereby forward bias the diodes 62 and 62'. As a result, the bases of the first and second bipolar transistors 1 and 2 have a negative potential.

The operation of the optoelectronic switch of the fifth embodiment is different from that of the first embodiment in its reset operation, but analogous in the light injection and the light emission. The operation of the optoelectronic switch of the fifth embodiment will be described below with reference to FIG. 10.

When light is injected into the bipolar transistors 1 and 2, the positive voltage +V from the DC power supply is applied to the cathodes of the diodes 62 and 62' to thereby reverse-bias the diodes 1 and 2. As a result, the bases of the bipolar transistors 1 and 2 may be regarded as being electrically disconnected from the diodes 62 and 62'. Then, the circuit configuration in this state may be regarded as being the same as that illustrated in FIG. 2 in the first embodiment according to the present invention. Therefore, one of the bipolar transistors 1 and 2, which receives a light, turns ON and the other receiving no light or a light having a lower intensity turns OFF by the effect of the positive feedback. The one of the bipolar transistors 1 and 2 in the ON state then shows a light emission until either the DC power supply 4 supplies zero voltage to the optoelectronic switch or the DC power supply 61 supplies the negative voltage −V, whichever comes first. In this embodiment, the DC power supply 4 continues to supply the positive voltage not only in the optical switching operation but also the reset operation.

When the DC power supply 62 supplies the cathodes of the diodes 62 and 62' with the negative voltage −V, a reset operation of the optoelectronic switch is initiated for a subsequent optical switching operation. As a result, the diodes 62 and 62' are forward-biased and then excess carriers in the base layers of the bipolar transistors 1 and 2 are extracted through the diodes 62 and 62' until most of the excess carriers in the base layers of the first and second bipolar transistors 1 and 2 are extracted through the diodes 62 and 62' to thereby complete the reset operation for a subsequent optical switching operation.

The application of the negative voltage to the cathode of the diodes 62 and 62' improves the speed of the reset operation in which most of the excess carriers in the base layers of the first and second bipolar transistors 1 and 2 are extracted through the diodes 62 and 62'.

Figure 8:
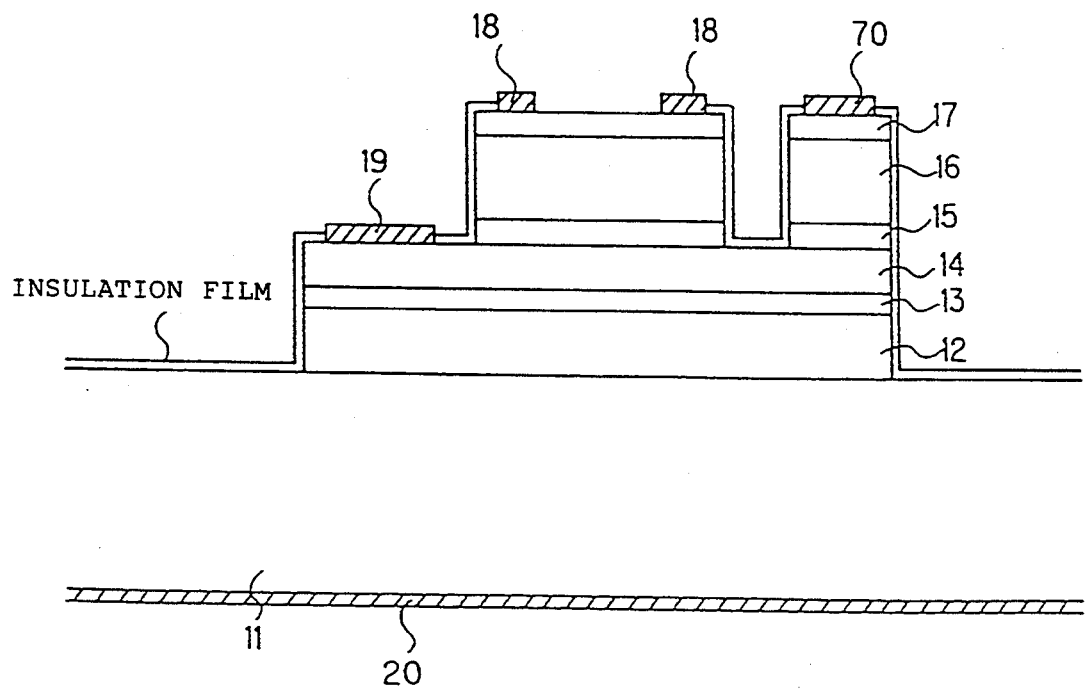
FIG. 8 is a fragmentary cross sectional elevation view illustrative of the novel optoelectronic switching device in the fourth embodiment according to the present invention.

FIG. 8 illustrates a novel structure of the bipolar transistor and the diode employed in the novel optoelectronic switch in the fifth embodiment according to the present invention. The pairs of the bipolar transistors 1 and 2 and the diodes 62 and 62' illustrated in FIG. 7B are formed on a single semiconductor substrate.

A novel npn bipolar transistor employed in the optoelectronic switch is formed on a substrate 11 made of n-GaAs. An n-AlGaAs layer 12 is formed on the n-GaAs substrate 11. An n-AlGaAs graded layer 13 is formed on the n-AlGaAs layer 12. A p-GaAs layer 14 is formed on the n-AlGaAs graded layer 13. An n-AlGaAs graded layer 15 is formed on the p-GaAs layer 14. An n-AlGaAs layer 16 is formed on the n-AlGaAs graded layer 15. A n-GaAs layer 17 is formed on the n-AlGaAs layer 16. An aperture is formed in the n-GaAs layer 17 and penetrates through the n-AlGaAs layers 16 and 15 thereby the layers 15, 16, and 17 are divided into two parts, a first part serves as an emitter layer of the bipolar transistor and a second part serves as a cathode of the diode. The n-AlGaAs layer 12 serves as an emitter layer in the bipolar transistor. The p-GaAs layer 14 serves not only as a base layer of the bipolar transistor but also as an anode of the diode. A part of the n-AlGaAs layer 16 serves as a collector layer and another part serves as a cathode. The n-GaAs layer serves as a contact layer.

A collector electrode 18 is formed on the first part of the n-GaAs contact layer overlaying the collector layer 16 of the bipolar transistor. The collector electrode 18 has a window through which light or photons are injected into the bipolar transistor. A cathode electrode 70 is formed on the second part of the n-GaAs contact layer 17 overlaying the cathode of the diode. An electrode 19 is formed on the layer 14. The electrode 19 serves not only as a base electrode but also as an anode electrode. An emitter electrode 20 which is connected directly to a ground line is formed on an opposite surface of the substrate 11 to the emitter layer 12 so as to allow the above emitter electrode 20 to serve as a common emitter electrode with a counterpart of the illustrated bipolar transistor. An insulation film is formed on an entire surface of the bipolar transistor, but for the respective electrodes 18, 19 and 20 and the window.

The n-AlGaAs graded layers 13 and 15 provide a sloped energy band profile free from any potential barrier like the energy band discontinuity. Such a sloped energy band profile permits carriers such as electrons to move rapidly across the opposite interfaces of the base layer 14. This permits the bipolar transistor to possess a high speed performance for a high speed switching operation of the novel semiconductor optoelectronic switch.

The p-GaAs base layer 14 has a narrower band gap than that of the n-AlGaAs emitter and collector layers 12 and 16 sandwiching the base layer 14 so that in the saturated state where the bipolar transistor shows almost no current gain effect, the excess carriers are accumulated in the base layer 14. This causes an intrinsic recombination process by which electrons make a direct band-to-band transition. The recombination process causes a luminescence or a light emission.

As described above and illustrated in FIG. 8, the novel bipolar transistor has a common electrode 19 and no additional electrodes nor additional elements resulting in a simple structure suitable for integration into two-dimensional arrays.

The bipolar transistor and the diode illustrated in FIG. 8 may be employed in the fourth embodiment according to the present invention.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the spirit and scope of the invention.

What is claimed is:

1. A heterostructure optoelectronic switching device exhibiting a switching operation in response to a light injection for a subsequent light emission, said switching device comprising:

a pair of first and second bipolar transistors made of semiconductors having a direct band-to-band transition, each of said first and second bipolar transistors comprising collector and emitter layers and a base layer having a narrower energy band gap than energy band gaps of said collector and emitter layers, said base layers of said first and second bipolar transistors being connected to said collector layers of said second and first bipolar transistors respectively to allow said device to have a positive feedback feature, said emitter layers of said first and second bipolar transistors being connected to a first terminal, said collector layers of said first and second bipolar transistors being connected respectively through first and second resistors to a second terminal to which a voltage is applied which is higher than a voltage applied to said first terminal; each of said first and second bipolar transistors comprising:

a first semiconductor multi-layer reflecting mirror formed on a first surface of a substrate made of n-GaAs;

an emitter layer made of n-AlGaAs formed on said first semiconductor multi-layer reflecting mirror;

a first n-AlGaAs graded layer formed on said n-AlGaAs emitter layer;

a base layer made of p-GaAs formed on said first n-AlGaAs graded layer;

a second n-AlGaAs graded layer formed on said p-GaAs base layer;

a collector layer made of n-AlGaAs formed on said second n-AlGaAs graded layer;

a second semiconductor multi-layer reflecting mirror formed on said n-AlGaAs collector layer;

a collector electrode formed on said second semiconductor multi-layer reflecting mirror, said collector electrode having a window through which light is injected;

a base electrode formed on said p-GaAs base layer; and an emitter electrode formed on a second surface of said n-GaAs substrate.

2. A heterostructure optoelectronic switching device exhibiting a switching operation in response to a light injection for a subsequent light emission, said switching device comprising:

a pair of first and second bipolar transistors made of semiconductor having a direct band-to-band transition, each of said first and second bipolar transistors comprising collector and emitter layers and a base layer having a narrower energy band gap than energy band gaps of said collector and emitter layers, said base layers of said first and second bipolar transistors being connected to said collector layers of said second and first bipolar transistors respectively to have said device to show a positive feedback feature, said emitter layers of said first and second bipolar transistors being connected to a first terminal, said collector layers of said first and second bipolar transistors being connected respectively through first and second resistors to a second terminal to which a voltage is applied which is higher than a voltage applied to said first terminal; and a pair of first and second diodes connected, at anode electrodes, to said base layers of said first and second bipolar transistors respectively, and said first and second diodes being connected, at cathode electrodes, to a third terminal; a combination of one of said bipolar transistors and said diode comprising:

an emitter layer made of n-AlGaAs formed on a first surface of a substrate made of n-GaAs;

a first n-AlGaAs graded layer formed on said n-AlGaAs emitter layer;

a base-cathode layer made of p-GaAs formed on said first n-AlGaAs graded layer, said base-cathode layer serving both as a base layer of said bipolar transistor and as a cathode layer of said diode;

a second n-AlGaAs graded layer formed on said p-GaAs base layer;

a collector layer made of n-AlGaAs formed on said second n-AlGaAs graded layer;

a contact layer made of n-GaAs formed on said n-AlGaAs collector layer;

an anode layer formed on said base-cathode layer, said anode layer being electrically separated from said collector layer through an isolation;

an anode electrode formed on said anode layer;

a collector electrode formed on said n-GaAs contact layer, said collector electrode having a window through which light is injected;

a base-cathode electrode formed on said p-GaAs base layer, said base-cathode electrode serving both as a base electrode of said bipolar transistor and a cathode electrode of said diode; and an emitter electrode formed on a second surface of said n-GaAs substrate.

3. The device as claimed in claim 1, wherein each of said first and second bipolar transistors further comprises:
a contact layer made of n-GaAs disposed between said collector layer and said second semiconductor multi-layer reflecting mirror and formed on said n-AlGaAs collector layer, said mirror being formed on said contact layer.

4. The device as claimed in claim 1, wherein each of said first and second bipolar transistors further comprises:
a contact layer made of n-GaAs disposed between said collector layer and said second semiconductor multi-layer reflecting mirror and formed on said n-AlGaAs collector layer; and
a p-diffusion region formed so as to penetrate a part of said contact, collector and second graded layers and to reach said base layer.

5. The device as claimed in claim 1, wherein said first and second terminals are respectively connected to a ground line and a DC power supply.

6. The device as claimed in claim 2, wherein said DC power supply begins to supply a positive voltage to said second terminal when a light is injected into either said first or second bipolar transistor for a subsequent light emission, and thereafter supplies the zero voltage to said second terminal to extract excess carriers from said base layer for a reset operation.

7. The device as claimed in claim 1, wherein said first and second bipolar transistors are formed on a single substrate.

8. The device as claimed in claim 1, wherein each of said first and second semiconductor multi-layer reflecting mirrors comprises laminations of alternating n-AlGaAs layers and n-AlAs layers, each of said n-AlGaAs layer and said n-AlAs layer having a thickness approximately equal to a quarter of a wavelength of a laser to be emitted from said bipolar transistor.

9. The device as claimed in claim 8, wherein a total thickness of said emitter, collector, base and first and second graded layers is approximately equal to a number given by multiplying a half of said wavelength of said laser by an integer.

10. The device as claimed in claim 9, wherein said base layer is positioned at an anti-node of a standing wave of a light confined between said first and second semiconductor multilayer reflecting mirrors.

11. The device as claimed in claim 2, wherein said first, second and third terminals are connected to a ground line and first and second DC power supplies respectively.

12. The device as claimed in claim 11, wherein:
said first DC power supply continues to supply a positive voltage to said second terminal; and
said second DC power supply begins to supply a positive voltage to said third terminal when a light is injected into either said first or second bipolar transistor for a subsequent light emission, and thereafter supplies zero or negative voltage to said third terminal to extract excess carriers from said base layer for a reset operation.

13. The device as claimed in claim 2, wherein said first and second bipolar transistors are formed on a single substrate.

* * * * *